(12) United States Patent
Nakai et al.

(10) Patent No.: US 12,343,979 B2
(45) Date of Patent: Jul. 1, 2025

(54) DEVICE AND METHOD OF MANUFACTURING THE DEVICE

(71) Applicant: CANON KABUSHIKI KAISHA, Tokyo (JP)

(72) Inventors: Noriyuki Nakai, Tokyo (JP); Takamitsu Hoshihira, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 196 days.

(21) Appl. No.: 18/145,361

(22) Filed: Dec. 22, 2022

(65) Prior Publication Data
US 2023/0219324 A1  Jul. 13, 2023

(30) Foreign Application Priority Data

Jan. 13, 2022  (JP) ................................. 2022-003468

(51) Int. Cl.
| | | |
|---|---|---|
| B32B 7/12 | (2006.01) | |
| B32B 3/26 | (2006.01) | |
| B32B 37/12 | (2006.01) | |
| B81B 1/00 | (2006.01) | |
| B81C 3/00 | (2006.01) | |

(52) U.S. Cl.
CPC ................ *B32B 7/12* (2013.01); *B32B 3/263* (2013.01); *B32B 37/12* (2013.01); *B81B 1/002* (2013.01); *B81B 2201/052* (2013.01); *B81C 3/001* (2013.01); *B81C 2203/032* (2013.01)

(58) Field of Classification Search
CPC . B32B 3/263; B32B 37/12; B32B 7/12; B41J 2/1603; B41J 2/1606; B41J 2/1623; B41J 2/1628; B41J 2/1629; B41J 2/1631; B41J 2/1632; B41J 2/1634; B41J 2/1645; B81B 1/002; B81B 2201/052; B81C 2201/019; B81C 2203/032; B81C 3/001
See application file for complete search history.

(56) References Cited

U.S. PATENT DOCUMENTS

2018/0269174 A1   9/2018   Fathi et al.

FOREIGN PATENT DOCUMENTS

| JP | 5-8388 A | 1/1993 |
|---|---|---|
| JP | 2004-188653 A | 7/2004 |
| JP | 2008-36936 A | 2/2008 |
| JP | 2012-16934 A | 1/2012 |
| JP | 2020-82548 A | 6/2020 |
| JP | 2021-20387 A | 2/2021 |

*Primary Examiner* — Lawrence D Ferguson
(74) *Attorney, Agent, or Firm* — Venable LLP

(57) ABSTRACT

A device includes a first member, a second member, and a bonding layer. A first surface of the first member and a second surface of the second member are bonded to each other via the bonding layer. The bonding layer includes a filler particle configured to be in contact with both of the first surface and the second surface, and a solidified adhesive. A distance between the first surface and the second surface is smaller than a diameter of the filler particle at at least one portion of an outer edge of the bonding layer.

14 Claims, 11 Drawing Sheets

PRIOR ART

PRIOR ART

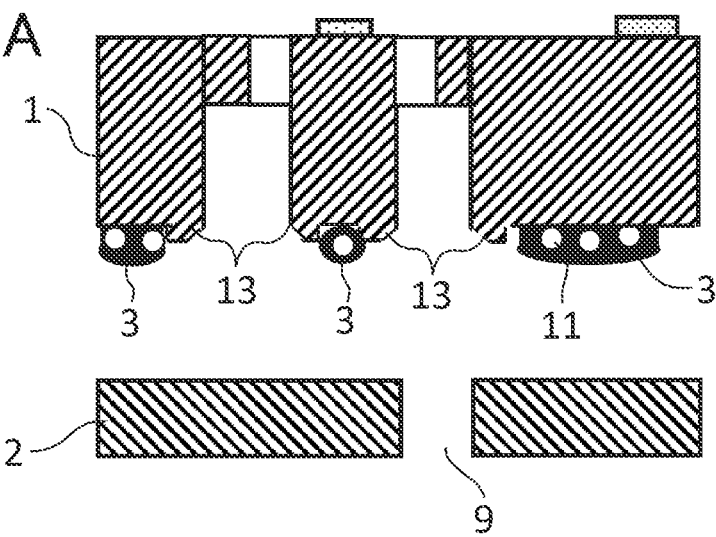
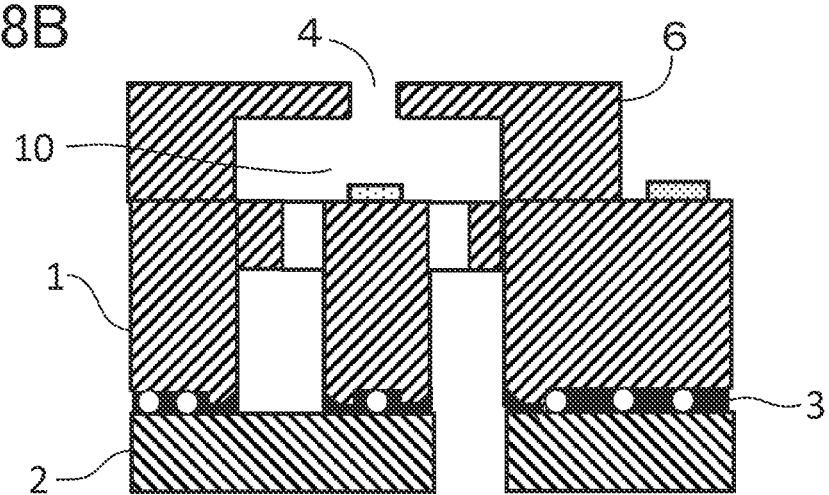
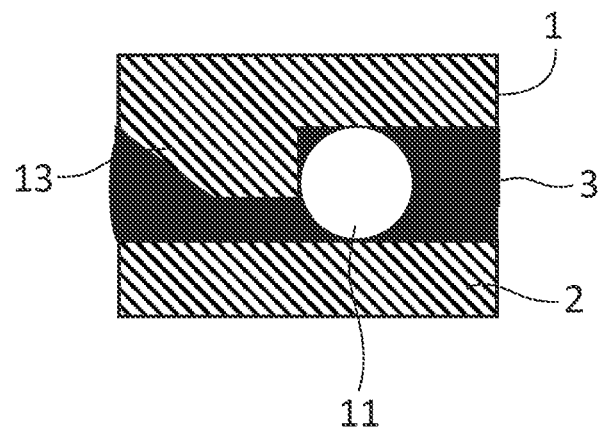

G < D

G < D

DEVICE AND METHOD OF MANUFACTURING THE DEVICE

BACKGROUND OF THE INVENTION

Field of the Invention

The present invention relates to a device including two members bonded to each other via a bonding layer.

Description of the Related Art

The bubble jet (registered trademark), the piezo jet, and the like are known as devices (hereinafter referred to as inkjet heads) that eject ink. The bubble jet flies droplets by instantly vaporizing the ink by using a heater, and the piezo jet urges droplets by using a piezoelectric element. For the inkjet head, it is required to increase not only the printing performance, such as resolution and printing speed, but also the mass productivity. In general, the inkjet head is manufactured by bonding a plurality of members to each other by using adhesive. However, if the thickness of the layer of the adhesive is uneven, the shape accuracy of the inkjet head deteriorates, so that the desired printing performance will not be achieved.

Japanese Patent Application Publication No. H05-8388 describes a technique for manufacturing inkjet heads that use a piezoelectric element. In this technique, the piezoelectric element and a top plate are bonded to each other by using adhesive in which particles having a uniform particle diameter are mixed.

As described in Japanese Patent Application Publication No. H05-8388, if the adhesive in which the particles having a uniform particle diameter is sandwiched between the piezoelectric element and the top plate and pressed, the particles serve as a spacer that determines a distance between the members. Thus, it can be expected that the bonding layer have a uniform thickness. For this reason, the adhesive in which the particles are mixed can be used not only for the bonding of the piezoelectric element and the top plate, but also for the bonding of members of the inkjet head.

For ensuring the strength of bonding of members and uniforming the thickness of the bonding layer, it is necessary to spread the adhesive on the whole of the bonding layer, and to cause the particles to serve as a spacer that determines a distance between the members. For this reason, an adequate amount of adhesive that will spread on the whole of the bonding surface is applied onto the bonding surface of one or both of the members; and then, the members are pressed against each other until the particles are sandwiched between both of the members. In this manner, the adhesive is pressed and spread on the whole of the bonding surface.

In practice, however, it is not easy to precisely control the amount and the position of adhesive applied onto the bonding surface. Thus, in consideration of mass productivity, the adhesive is spread on the whole of the bonding surface by applying a larger amount of adhesive onto the bonding surface and then pressing both of the members against each other. However, at an outer edge of the bonding layer, the adhesive may easily project from surfaces of both of the members, and at the position, a particle contained in the adhesive may be exposed. Even if the outer edge of the adhesive and the surfaces of both of the members are flush with each other, a particle contained in the adhesive may be exposed.

Also in a case where members that constitute a flow channel of ink are bonded to each other, since it is required to ensure the strength of bonding of the members and uniform the thickness of the bonding layer, the adhesive in which the particles are mixed can be used.

However, if a particle contained in the adhesive is exposed to the flow channel of ink, problems will occur. That is, because a crack easily appears in an interface between the exposed particle and the solidified adhesive, the particle may fall off the bonding layer and mix with the ink. In addition, if a crack appears, the ink will permeate the solidified adhesive through the crack, deteriorating the bonding strength and causing the members to easily peel off from each other. Thus, if the adhesive in which particles are mixed is used for the bonding of members that constitute a flow channel of ink, the reliability and life of the inkjet head may be reduced.

For these reasons, it has been desired to achieve a bonding method that uniforms the thickness of a bonding layer between members and ensures sufficient bonding strength, and that prevents any particle, contained in the adhesive, from being exposed at an outer edge of the bonding layer.

SUMMARY OF THE INVENTION

According to a first aspect of the present invention, a device includes a first member, a second member, and a bonding layer. A first surface of the first member and a second surface of the second member are bonded to each other via the bonding layer. The bonding layer includes a filler particle configured to be in contact with both of the first surface and the second surface, and a solidified adhesive. A distance between the first surface and the second surface is smaller than a diameter of the filler particle at at least one portion of an outer edge of the bonding layer.

According to a second aspect of the present invention, a method of manufacturing a device includes applying adhesive that contains a filler particle, onto a predetermined portion of a first surface of a first member, causing a second surface of a second member to face the first surface, and causing the first surface and the second surface to approach each other until the filler particle abuts against both of the first surface and the second surface, and then solidifying the adhesive. A convex portion is formed along at least one portion of an edge of the first surface of the first member, and/or at least one portion of an edge of the second surface of the second member. When the first surface and the second surface are caused to approach each other, the convex portion enables a liquid-phase component of the adhesive to flow to an edge of the first surface of the first member and to an edge of the second surface of the second member, and blocks the filler particle from moving to the edge of the first surface of the first member and to the edge of the second surface of the second member.

Further features of the present invention will become apparent from the following description of exemplary embodiments with reference to the attached drawings.

BRIEF DESCRIPTION OF THE DRAWINGS

FIG. 8A is a diagram illustrating a state where the first flow-channel substrate 1 and a second flow-channel substrate 2 of the second embodiment are disposed so as to face each other.

FIG. 8B is a partial cross-sectional view of an inkjet head of the second embodiment in which the first flow-channel substrate 1 and the second flow-channel substrate 2 are bonded to each other.

FIG. 8C is a partial cross-sectional view in which the convex portion 13 and its surroundings are enlarged.

DESCRIPTION OF THE EMBODIMENTS

Figure 1A:
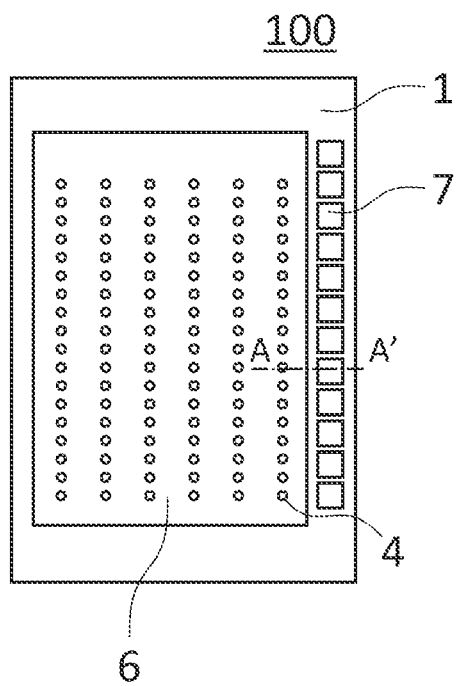
FIG. 1A is a top view of an inkjet head 100 of a first embodiment.

Next, a device of an embodiment of the present invention and a method of manufacturing the device will be described with reference to the accompanying drawings. Note that since the embodiments described below are examples, detailed configurations and the like may be modified as appropriate by a person skilled in the art, without departing the spirit of the present invention.

In addition, in the drawings referred to in the below-described embodiments and examples, a component given an identical reference numeral has an identical function, unless otherwise specified.

First Embodiment

Figure 1B:
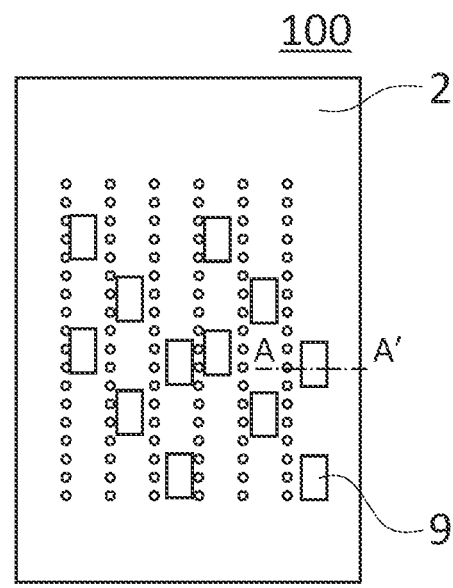
FIG. 1B is a bottom view of the inkjet head 100 of the first embodiment.
Figure 1C:
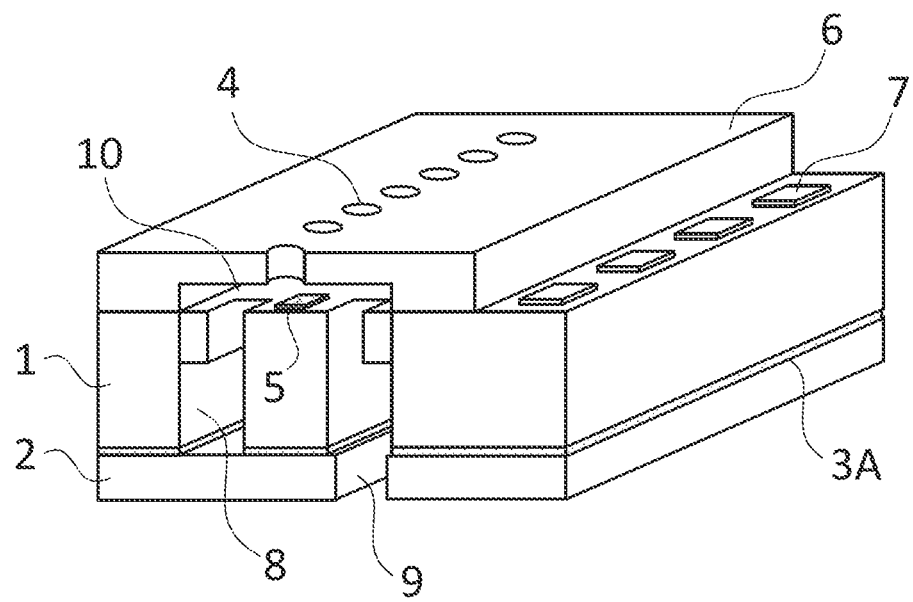
FIG. 1C is a partial perspective view for illustrating a cross section taken along a line A-A' illustrated in FIGS. 1A and 1B.

First, a structure of an inkjet head of a first embodiment will be described. FIG. 1A is a top view of an inkjet head 100 of the first embodiment of the present invention. FIG. 1B is a bottom view of the inkjet head 100. FIG. 1C is a partial perspective view for illustrating a cross section taken along a line A-A' illustrated in FIGS. 1A and 1B.

The inkjet head 100 includes a first flow-channel substrate 1 that serves as a first member, a second flow-channel substrate 2 that serves as a second member, a bonding layer 3A, ejection orifices 4, ejection-energy generation elements 5, an orifice plate 6, and electrodes 7. Note that other components (such as an electric circuit and a wiring pattern) of the inkjet head that are not directly related to the description of the present invention are not illustrated in the figures.

The first flow-channel substrate 1 and the second flow-channel substrate 2 are bonded to each other via the bonding layer 3A, and the first flow-channel substrate 1 and the orifice plate 6 are bonded to each other via the bonding layer 3A. The first flow-channel substrate 1, the second flow-channel substrate 2, and the orifice plate 6 are integrated with each other, and constitute a flow channel structure. In the flow channel structure, a penetrating first flow channel 8 and a penetrating second flow channel 9 are formed. The penetrating first flow channel 8 and the penetrating second flow channel 9 communicate with each other, and constitute an ink supply channel. Note that in FIG. 1C, only one portion of the bonding layer 3A is illustrated for convenience of description.

In the orifice plate 6, the plurality of ejection orifices 4 are formed. The arrangement (the number and positions) of the ejection orifices 4 are not limited to the example illustrated in the figures. In the first flow-channel substrate 1, the ejection-energy generation elements 5 are disposed for ejecting liquid, at positions corresponding to the ejection orifices 4. The ejection-energy generation elements 5 are driven by electric signals transmitted from the outside via the electrodes 7. Preferably, the ejection-energy generation elements 5 are electrothermal conversion elements or piezoelectric elements.

The ink (to be ejected) is supplied from an ink tank (not illustrated) to a flow channel 10 through the penetrating second flow channel 9 and the penetrating first flow channel 8, and ejected from the ejection orifices 4 when the ink is given the ejection energy by the ejection-energy generation elements 5.

Next, a method of making the inkjet head 100 will be described. In particular, a method of bonding the first flow-channel substrate 1 and the second flow-channel substrate 2 to each other by using the adhesive 3 will be described. Note that the below-described bonding method is not limited to the method of bonding the first flow-channel substrate 1 and the second flow-channel substrate 2 to each other. That is, the below-described method can be widely used for bonding members to each other for forming the flow channel of liquid (ink).

First, the first flow-channel substrate 1 and the second flow-channel substrate 2 will be described. Preferably, the base material of each of the substrates is silicon. However, the base material may be one of silicon carbide, silicon nitride, a variety of types of glass, such as quartz glass, or borosilicate glass, one of a variety of types of ceramic, such as alumina or gallium arsenide, or a resin. In the first flow-channel substrate 1, a groove that serves as the penetrating first flow channel 8 is formed; in the second flow-channel substrate 2, a groove that serves as the penetrating second flow channel 9 is formed. Examples of forming the penetrating flow channels include dry etching, wet etching, and a machining method such as laser machining. In addition, for adjusting the height of the flow channel in a direction in which the flow channel extends, the substrate may be made thinner by grinding the substrate by using back grind or CMP.

Preferably, the adhesive 3 used for bonding the substrates has excellent adhesion property to the substrates. In addition, it is preferable that the adhesive 3 contain less air bubbles, can be easily applied onto a substrate, and have lower viscosity so that the thickness of the layer of the adhesive can be easily controlled when the adhesive is applied onto a substrate. Preferably, the adhesive 3 includes a material selected from a group consisting of epoxy resin, acrylic resin, silicon resin, benzocyclobutene resin, polyamide resin, polyimide resin, and urethane resin. Examples of the method of curing the adhesive 3 include a thermal curing method and an ultraviolet delay curing method. If one of the substrates has permeability to ultraviolet light, an ultraviolet curing method may be used.

In the adhesive 3, glass beads having a predetermined particle diameter are mixed as the filler particles 11. The filler particles, which are mixed in the adhesive, may be any particles as long as the particles have predetermined strength and a predetermined particle diameter. Thus, the material of the particles may be alumina or titania. The filler particles, which are mixed in the adhesive, function as a spacer that determines the distance between the first flow-channel substrate 1 and the second flow-channel substrate 2 when the substrates are pressed against each other for bonding the substrates. In other words, the bonding layer 3A formed by solidifying the adhesive 3 contains the solidified adhesive 3 and the filler particles 11, and the maximum thickness of the bonding layer 3A is determined by the particle diameter of the filler particles 11. Preferably, the particle diameter of the filler particles is equal to or larger than 1 μm and smaller than 20 μm.

Next, a procedure for bonding the first flow-channel substrate 1 and the second flow-channel substrate 2 to each other will be specifically described with reference to the figures. Note that the figures referred to in the following description are made schematically for convenience of description. Thus, the shape, size, number, arrangement, and the like of each member are not necessarily the same as those of a real member.

Figure 2A:
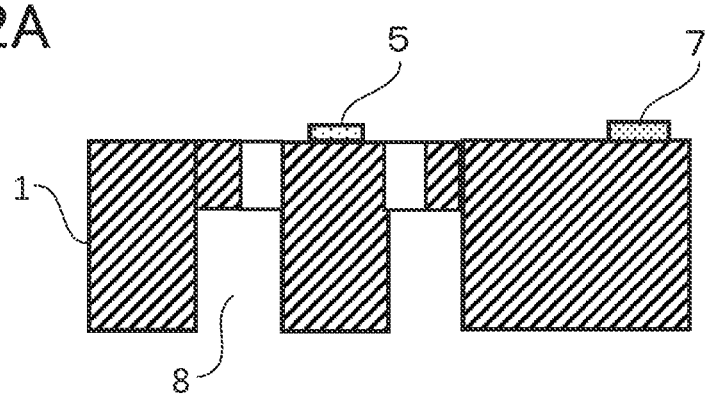
FIG. 2A is a partial cross-sectional view of a first flow-channel substrate 1 of the first embodiment that is being manufactured.

FIG. 2A is a partial cross-sectional view of the first flow-channel substrate 1 in which a groove that serves as the penetrating first flow channel 8, the ejection-energy generation element 5, and the electrode 7 are formed. As described below, the bottom surface (i.e., a first surface of a first member) of the first flow-channel substrate 1, illustrated in FIG. 2A, is bonded to the top surface (i.e., a second surface of a second member) of the second flow-channel substrate 2 via the adhesive 3.

Figure 2B:
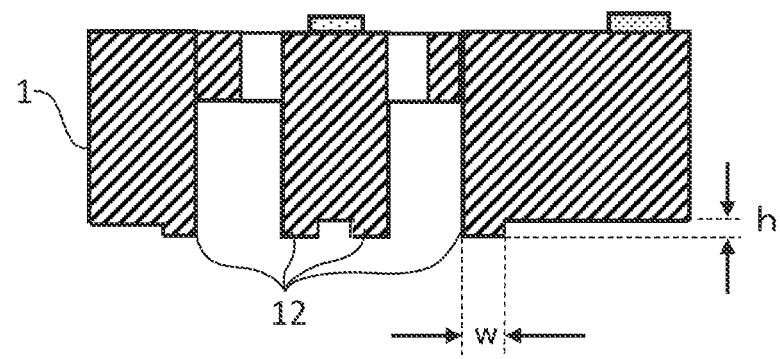
FIG. 2B is a partial cross-sectional view of the first flow-channel substrate 1 that is in a stage where a convex portion 12 has been formed on the first flow-channel substrate 1.

In the present embodiment, before the first flow-channel substrate 1 is bonded to the second flow-channel substrate 2, a convex portion 12 having a predetermined height h and a predetermined width w is formed on the bottom surface of the first flow-channel substrate 1, as illustrated in FIG. 2B. The convex portion 12 is formed along an edge of the bottom surface of the first flow-channel substrate 1, which is bonded to the second flow-channel substrate 2. That is, the convex portion 12 is formed along a flow channel of liquid (ink). The convex portion 12 projects in a direction in which the distance between the bottom surface of the first flow-channel substrate 1 and the top surface of the second flow-channel substrate 2 is decreased. The convex portion 12 may be formed by adding a material to the member illustrated in FIG. 2A, or by removing one portion from the bottom surface of the member illustrated in FIG. 2A so that the convex portion 12 is left. As described above, the convex portion 12 is formed before the first flow-channel substrate 1 is bonded to the second flow-channel substrate 2. Thus, the convex portion 12 may not necessarily be formed after the ejection-energy generation element 5 and the electrode 7 are disposed.

The convex portion 12 functions as a barrier that blocks the filler particles, contained in the adhesive, from reaching the flow channel of liquid, when the adhesive is spread on the whole of the bonding surface by pressing (after the application of the adhesive) the first flow-channel substrate 1 and the second flow-channel substrate 2 against each other in a direction in which the first flow-channel substrate 1 and the second flow-channel substrate 2 approach each other.

If the top surface of the second flow-channel substrate 2, to which the first flow-channel substrate 1 is bonded, is flat, the height h of the convex portion 12 is made smaller than the average particle diameter of the filler particles mixed in the adhesive, so that the adhesive can spread on the whole of the bonding surface. Preferably, the height h of the convex portion 12 is made equal to or larger than 20% of the average particle diameter of the filler particles and smaller than 80% of the average particle diameter, for allowing the adhesive to spread also on the convex portion 12 and preventing the filler particles from reaching the flow channel. That is, the height h of the convex portion 12 may be set in consideration of the average particle diameter of the filler particles mixed in the adhesive and variations of particle diameters of the filler particles. Note that the average particle diameter is a diameter of an average circle. That is, the shape of each particle in a plan view is regarded as a circle, and the diameter of the average circle is obtained by calculating diameters of the circles and calculating the average value of the diameters.

If the adhesive is applied onto the bottom surface of the first flow-channel substrate 1 by using a transfer method, it is preferable that the width w of the convex portion 12 be decreased to the extent that the adhesive is not transferred to the convex portion 12. This is because if the width w of the convex portion 12 is increased too much, the adhesive in which the filler particles are mixed will be transferred to the convex portion 12, and the filler particles may reach the flow channel when the substrates are pressed against each other. Thus, the width w of the convex portion 12 may be set in accordance with the viscosity and the transfer performance of the adhesive 3.

Figure 2C:
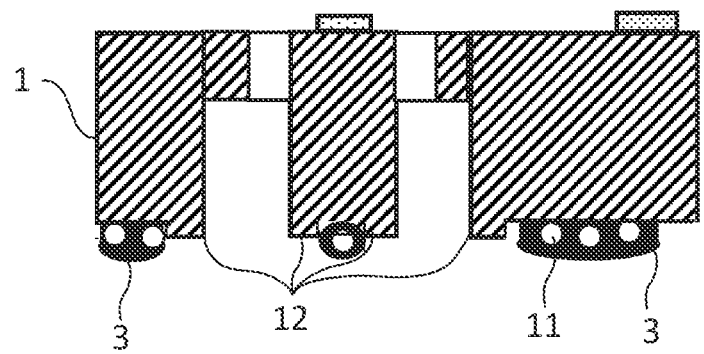
FIG. 2C is a partial cross-sectional view of the first flow-channel substrate 1 that is in a stage where the first flow-channel substrate 1 has been applied with an adhesive 3 in which filler particles 11 are mixed.

Then, as illustrated in FIG. 2C, the adhesive 3 in which the filler particles 11 are mixed is applied onto a predetermined portion of the bottom surface of the first flow-channel substrate 1 on which the convex portion 12 is formed. The adhesive 3 is applied onto an area other than the convex portion 12 (that is, an area around the convex portion). The amount of the adhesive applied onto the bonding surface is a necessary and sufficient amount to cover the whole of the bonding surface (to be bonded) when the adhesive is spread to a thickness equal to the particle diameter of the filler particles 11.

Figure 3A:
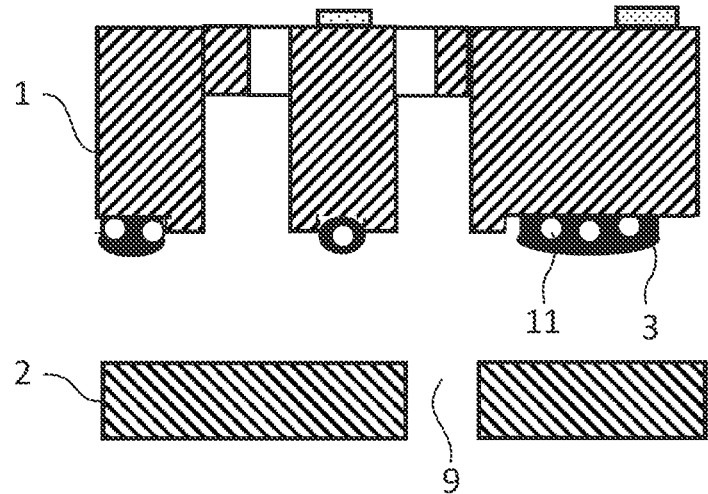
FIG. 3A is a diagram illustrating a state where the first flow-channel substrate 1 and a second flow-channel substrate 2 are disposed so as to face each other.

Then, as illustrated in FIG. 3A, the first flow-channel substrate 1 and the second flow-channel substrate 2 are positioned with respect to each other such that the bonding surface of the first flow-channel substrate 1 and the bonding surface of the second flow-channel substrate 2 face each other. As the first flow-channel substrate 1 and the second flow-channel substrate 2 are gradually pressed against each other in a direction in which the first flow-channel substrate 1 and the second flow-channel substrate 2 approach each other, the adhesive spreads gradually on the whole of the bonding surface.

Figure 3B:
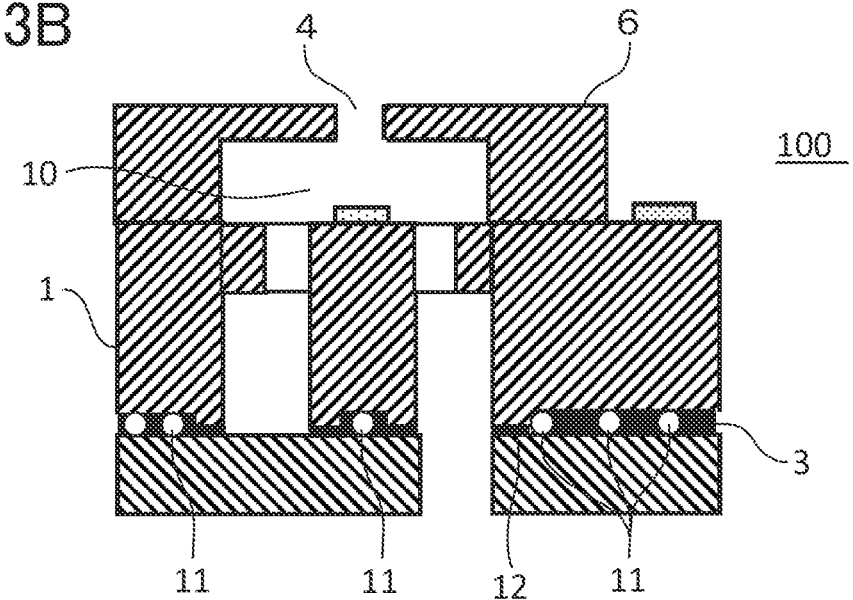
FIG. 3B is a partial cross-sectional view of the inkjet head 100 of the first embodiment in which the first flow-channel substrate 1 and the second flow-channel substrate 2 are bonded to each other.

When the first flow-channel substrate 1 and the second flow-channel substrate 2 are further pressed against each other, the filler particles 11 abut against both of the bottom surface of the first flow-channel substrate 1 and the top surface of the second flow-channel substrate 2, as illustrated in FIG. 3B. Since the filler particles 11 serve as a spacer, both of the substrates do not approach each other anymore. In a process in which the adhesive spreads on the whole of the bonding surface, the filler particles 11 also move, but do not reach the flow channel of liquid (ink) because the filler particles 11 are blocked by the convex portion 12.

If the diameter of the filler particles 11 is denoted by D, and the height of the convex portion 12 is denoted by h, a clearance (gap G) of D-h is produced between the convex portion 12 of the first flow-channel substrate 1 and the top surface of the second flow-channel substrate 2 because the top surface of the second flow-channel substrate 2 is flat. Thus, as illustrated in an enlarged view of FIG. 3C, when the substrates are pressed against each other, the liquid-phase component of the adhesive 3 flows into the clearance and spreads to the flow channel of liquid (ink).

The first flow-channel substrate 1 and the second flow-channel substrate 2 are then bonded to each other by solidifying the adhesive that has spread on the bonding surface, and then the orifice plate 6 is bonded to the first flow-channel substrate 1, so that the inkjet head 100 is completed as illustrated in FIG. 3B.

Figure 4:
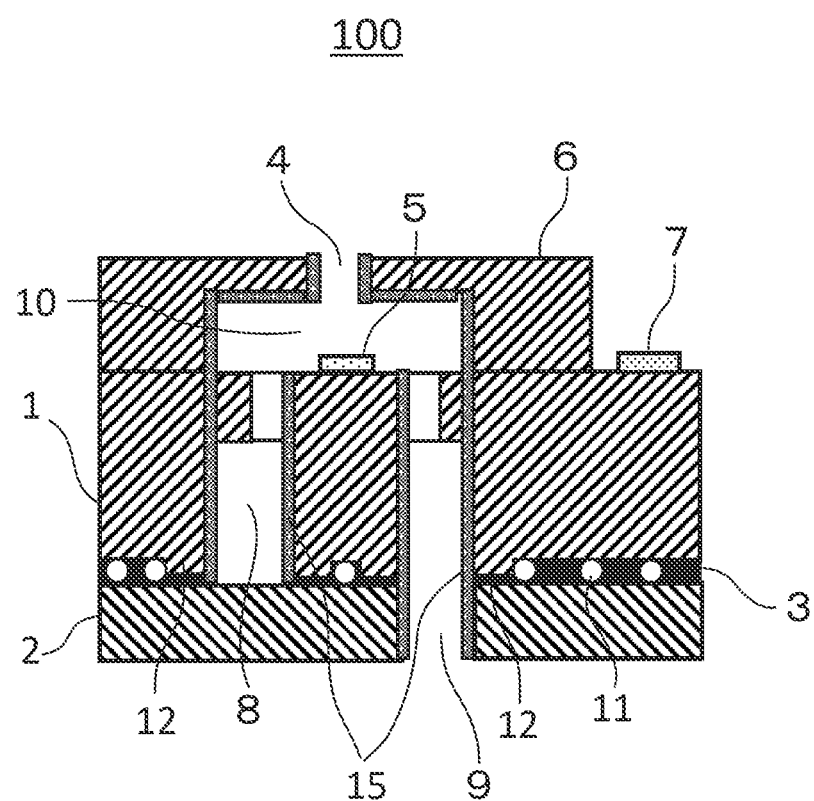
FIG. 4 is a partial cross-sectional view of the inkjet head 100 of the first embodiment, in which a protective film 15 is formed on the surface of a flow channel.

Note that a protective film 15 may be formed on the surface of the flow channel of liquid (ink), as illustrated in FIG. 4, for increasing the resistance of members that constitute the flow channel of liquid (ink). In the present embodiment, since the space between the convex portion 12 of the first flow-channel substrate 1 and the top surface of the second flow-channel substrate 2 is also filled with the adhesive, the protective film 15 can be formed so as to have a uniform thickness. The protective film 15 may be a silicon oxide film, a titanium oxide film, a silicon carbide film, or a tantalum oxide film.

As described above, in the present embodiment, since the space between the convex portion 12 of the first flow-channel substrate 1 and the second flow-channel substrate 2 (that faces the first flow-channel substrate 1) is also filled with the adhesive 3, the area of the bonding layer can be made larger, and thus both of the substrates can be bonded to each other by stronger bonding force. Since the distance between both of the substrates is determined by the particle diameter of the filler particles 11 that serve as a spacer, the maximum thickness of the layer of the adhesive 3 is made constant, and both of the substrates can be bonded to each other accurately in parallel (with high shape accuracy). In addition, since the filler particles 11 are blocked by the convex portion 12 when the adhesive spreads, the filler particles 11 are prevented from being exposed to the flow channel of liquid (the penetrating first flow channel 8, the penetrating second flow channel 9). That is, in the present embodiment, it is possible to achieve a bonding method that uniforms the thickness of a bonding layer between members and ensures sufficient bonding strength, and that prevents any particle, contained in the adhesive, from being exposed at an outer edge (edge portion) of the bonding layer.

First Comparative Embodiment

Figure 5A:
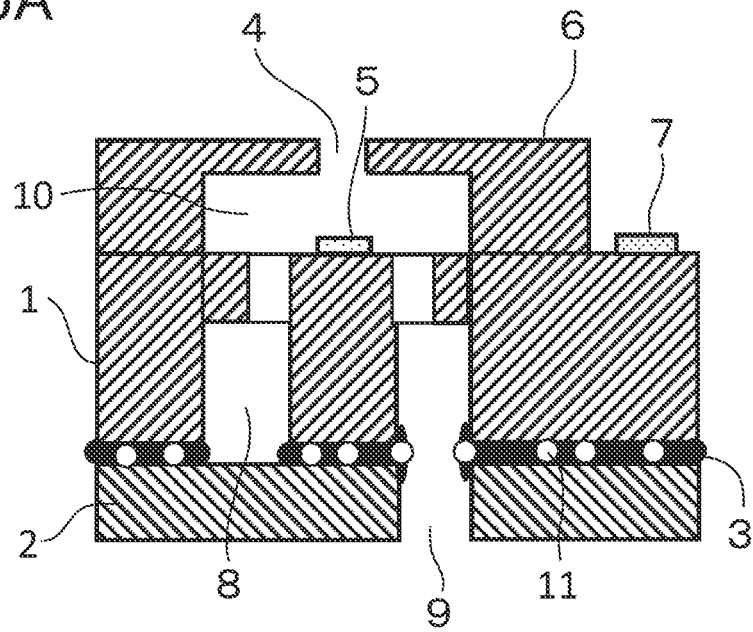
FIG. 5A is a partial cross-sectional view of an inkjet head of a first comparative embodiment.
Figure 5B:
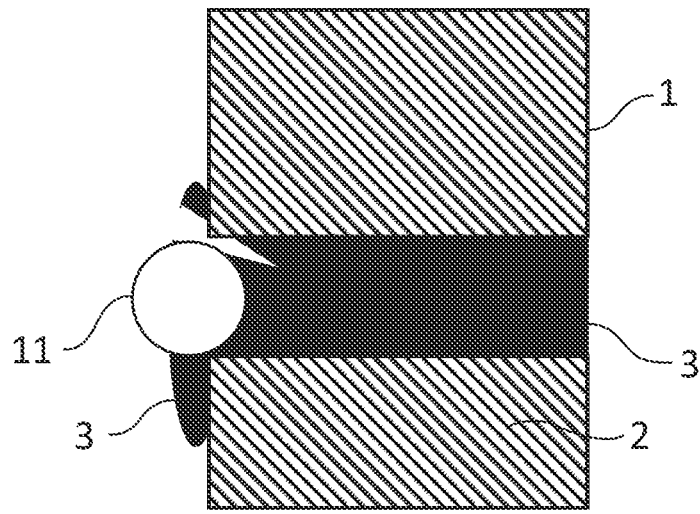
FIG. 5B is a partial cross-sectional view in which one portion of the inkjet head of the first comparative embodiment is enlarged.

Next, a first comparative embodiment will be described with reference to FIGS. 5A and 5B. Note that the description for features identical to those of the first embodiment will be simplified or omitted. FIG. 5A is a partial cross-sectional view of an inkjet head of the first comparative embodiment. FIG. 5B is an enlarged cross-sectional view in which one portion of FIG. 5A is enlarged.

The first comparative embodiment is the same as the first embodiment in that the first flow-channel substrate 1 and the second flow-channel substrate 2 are bonded to each other by using the adhesive 3 in which the filler particles 11 are mixed. In the first comparative embodiment, however, the convex portion 12 is not formed on the bottom portion of the first flow-channel substrate 1. That is, in the first comparative embodiment, when the first flow-channel substrate 1 and the second flow-channel substrate 2 are bonded to each other, the adhesive is spread on the whole of the bonding surface by pressing the flat surfaces against each other. However, since the convex portion 12 is not formed, the filler particles 11 also move, together with the liquid-phase component. Thus, a filler particle 11 is also pushed out, together with the liquid-phase component; and as illustrated in FIG. 5B, the surface of one portion of the filler particle 11 may be exposed to the flow channel of liquid (ink). Because a crack easily appears in an interface between the exposed filler particle 11 and the solidified adhesive, the filler particle 11 may fall off the bonding layer and mix with the ink if the use of the inkjet head of the first comparative embodiment is continued. In addition, if a crack appears, the ink will permeate the bonding layer through the crack. As a result, the crack grows, weakening the bonding strength and causing the bonding layer to easily break. Thus, the inkjet head of the first comparative embodiment has less reliability and life than those of the inkjet head of the first embodiment.

Second Comparative Embodiment

Figure 6A:
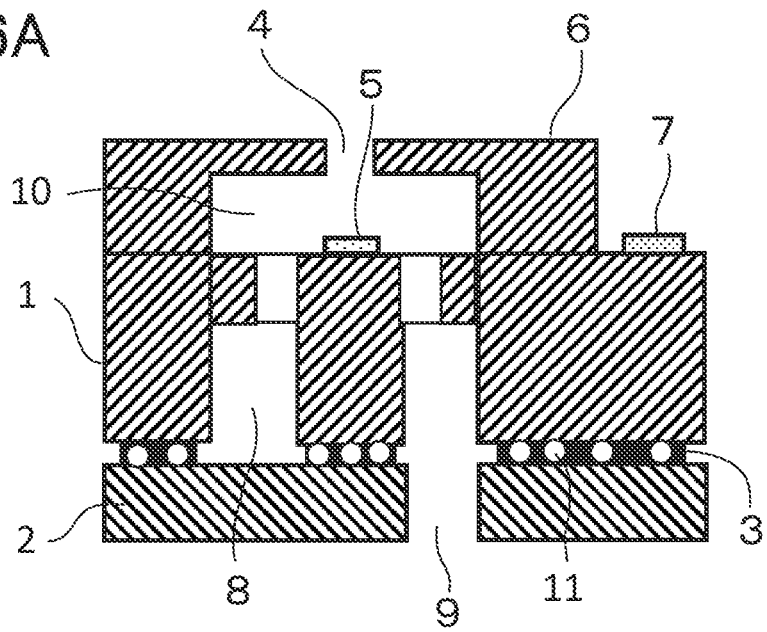
FIG. 6A is a partial cross-sectional view of an inkjet head of a second comparative embodiment.
Figure 6B:
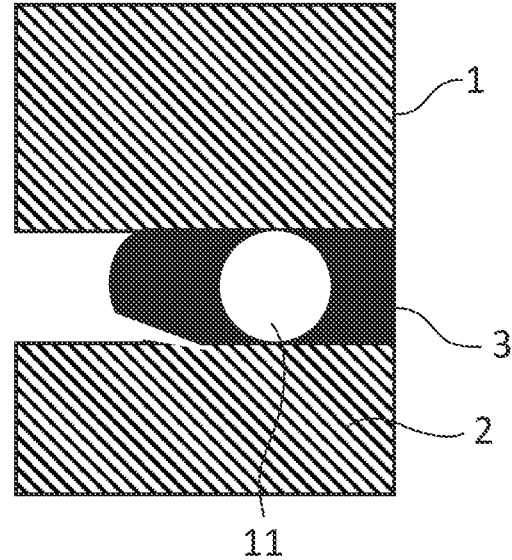
FIG. 6B is a partial cross-sectional view in which one portion of the inkjet head of the second comparative embodiment is enlarged.

Next, a second comparative embodiment will be described with reference to FIGS. 6A and 6B. Note that the description for features identical to those of the first embodiment or the first comparative embodiment will be simplified or omitted. FIG. 6A is a partial cross-sectional view of an inkjet head of the second comparative embodiment. FIG. 6B is an enlarged cross-sectional view in which one portion of FIG. 6A is enlarged.

The second comparative embodiment is the same as the first comparative embodiment in that the first flow-channel substrate 1 and the second flow-channel substrate 2 are bonded to each other by using the adhesive 3 in which the filler particles 11 are mixed, and that the convex portion 12 is not formed on the bottom portion of the first flow-channel substrate 1. In the second comparative embodiment, however, for preventing the filler particles 11 from being pushed out to the flow channel of liquid (ink), the adhesive 3 is prevented from spreading to the flow channel of liquid (ink) by reducing the amount of the adhesive applied onto the bonding surface.

In the second comparative embodiment, the filler particles 11 are not pushed out to the flow channel of liquid (ink), and are not exposed to the flow channel of liquid (ink). However, since the amount of the adhesive 3 is reduced, the bonding area of the bonding layer is reduced, and the bonding strength is made lower than that of the first embodiment. In addition, since the liquid (ink) flows into the clearance between the first flow-channel substrate 1 and the second flow-channel substrate 2, the liquid (ink) will easily permeate the bonding layer through the interface between the bonding layer and the substrate, further weakening the bonding strength and causing the bonding layer to easily break. Thus, the inkjet head of the second comparative embodiment has less reliability and life than those of the inkjet head of the first embodiment.

Second Embodiment

Next, an inkjet head of a second embodiment will be described. Note that the description for features identical to those of the first embodiment will be simplified or omitted.

Figure 3C:
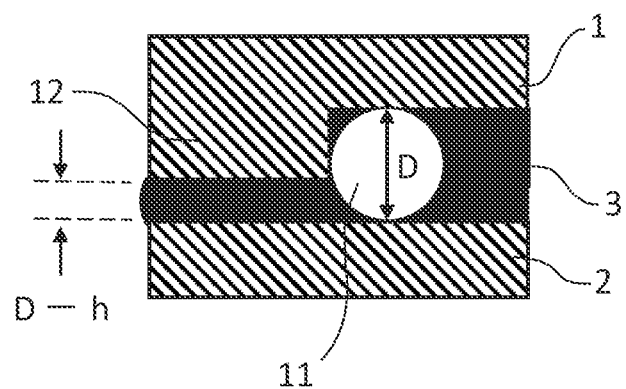
FIG. 3C is a partial cross-sectional view in which the convex portion 12 and its surroundings are enlarged.

The second embodiment is the same as the first embodiment in that a convex portion is formed along an edge of the bottom surface of the first flow-channel substrate 1 (that is bonded to the second flow-channel substrate 2), that is, formed along the flow channel of liquid (ink). In the above-described first embodiment, the cross-sectional shape of the convex portion 12 is a rectangle as illustrated in FIG. 3C, and the gap G between the leading edge of the convex portion 12 and the second flow-channel substrate 2 is constant across the convex portion 12 in the width direction of the convex portion 12.

In the second embodiment, however, as illustrated in FIG. 8C, the cross-sectional shape of a convex portion 13 is a trapezoid, and the convex portion 13 is formed such that the gap between the convex portion 13 and the second flow-channel substrate 2 increases in a direction extending toward the flow channel of liquid (ink). The convex portion 13 is shaped like this for preventing the filler particles 11 from reaching the flow channel of liquid (ink), and for allowing the liquid-phase component of the adhesive to easily reach the flow channel of liquid (ink). If the aim can be achieved, the shape of the convex portion 13 is not limited to the trapezoid illustrated in FIG. 8C, and may be any shape as long as the conductance for the viscous liquid-phase component of the adhesive increases as the liquid-phase component approaches the flow channel of liquid (ink). In other words, the shape of the convex portion 13 is set such that the gap between the first flow-channel substrate 1 and the second flow-channel substrate 2 increases in a direction extending toward the flow channel of liquid (ink). For example, the convex portion 13 may have steps, a plurality of tapered surfaces with different angles, or a curved slope.

Hereinafter, for making an inkjet head of the second embodiment, a method of bonding the first flow-channel substrate 1 and the second flow-channel substrate 2 to each other by using the adhesive 3 will be described with reference to the figures. Note that the figures referred to in the following description are made schematically for convenience of description. Thus, the shape, size, number, arrangement density, and the like of each member are not necessarily the same as those of a real member. Note that the below-described bonding method is not limited to the method of bonding the first flow-channel substrate 1 and the second flow-channel substrate 2 to each other. That is, the below-described method can be widely used for bonding members to each other for forming the channel of liquid (ink).

Figure 7A:
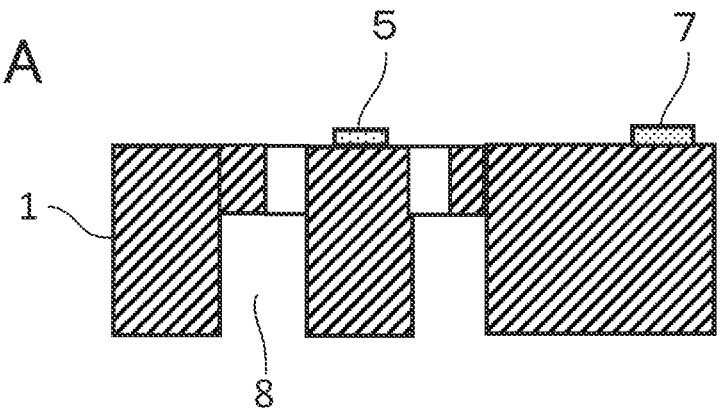
FIG. 7A is a partial cross-sectional view of a first flow-channel substrate 1 of a second embodiment that is being manufactured.

FIG. 7A is a partial cross-sectional view of the first flow-channel substrate 1 in which a groove that serves as the penetrating first flow channel 8, the ejection-energy generation element 5, and the electrode 7 are formed. The bottom surface of the first flow-channel substrate 1, illustrated in FIG. 7A, is bonded to the top surface of the second flow-channel substrate 2 via the adhesive 3.

Figure 7B:
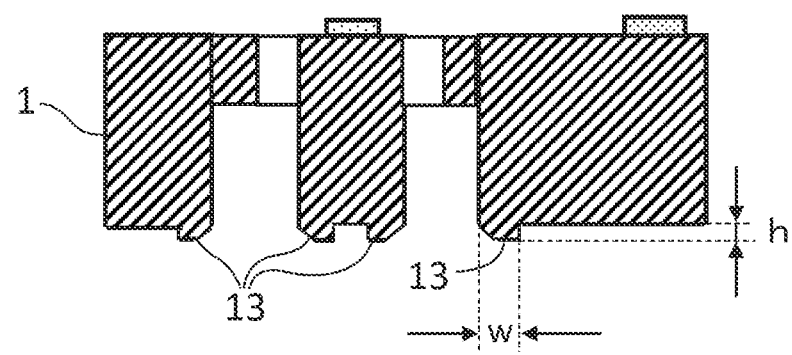
FIG. 7B is a partial cross-sectional view of the first flow-channel substrate 1 that is in a stage where a convex portion 13 has been formed on the first flow-channel substrate 1.

In the present embodiment, before the first flow-channel substrate 1 is bonded to the second flow-channel substrate 2, the convex portion 13 having a predetermined height h and a predetermined width w is formed in advance on the bottom surface of the first flow-channel substrate 1, as illustrated in FIG. 7B. The convex portion 13 is formed on the bottom surface of the first flow-channel substrate 1, which is bonded to the second flow-channel substrate 2, along the flow channel of liquid (ink). The convex portion 13 has a tapered surface formed on the flow channel of liquid (ink) side. The convex portion 13 may be formed by adding a material to the member illustrated in FIG. 7A, or by removing one portion from the bottom surface of the member illustrated in FIG. 7A so that the convex portion 13 is left. As described above, the convex portion 13 is formed before the first flow-channel substrate 1 is bonded to the second flow-channel substrate 2. Thus, the convex portion 12 may not necessarily be formed after the ejection-energy generation element 5 and the electrode 7 are disposed.

The convex portion 13 functions as a barrier that blocks the filler particles, contained in the adhesive, from reaching the flow channel of liquid, when the adhesive is spread on the whole of the bonding surface by pressing (after the application of the adhesive) the first flow-channel substrate 1 and the second flow-channel substrate 2 against each other in a direction in which the first flow-channel substrate 1 and the second flow-channel substrate 2 approach each other.

If the top surface of the second flow-channel substrate 2, to which the first flow-channel substrate 1 is bonded, is flat, the height h of the convex portion 12 is made smaller than the average particle diameter of the filler particles contained in the adhesive, so that the adhesive can spread on the whole of the bonding surface. Preferably, the height h of the convex portion 13 is made equal to or larger than 20% of the average particle diameter of the filler particles and smaller than 80% of the average particle diameter, for allowing the adhesive to spread also on the convex portion 13 and preventing the filler particles, contained in the adhesive, from reaching the flow channel. That is, the height h of the convex portion 13 may be set in consideration of the average particle diameter of the filler particles mixed in the adhesive and variations of particle diameters of the filler particles.

If the adhesive is applied onto the bottom surface of the first flow-channel substrate 1 by using a transfer method, it is preferable that the width w of the convex portion 13 be decreased to the extent that the adhesive is not transferred to the convex portion 13. This is because if the width w of the convex portion 13 is increased too much, the adhesive in which the filler particles are mixed will be transferred to the convex portion 13, and the filler particles may reach the flow channel when the substrates are pressed against each other. Thus, the width w of the convex portion 13 may be set in accordance with the viscosity and the transfer performance of the adhesive 3.

Figure 7C:
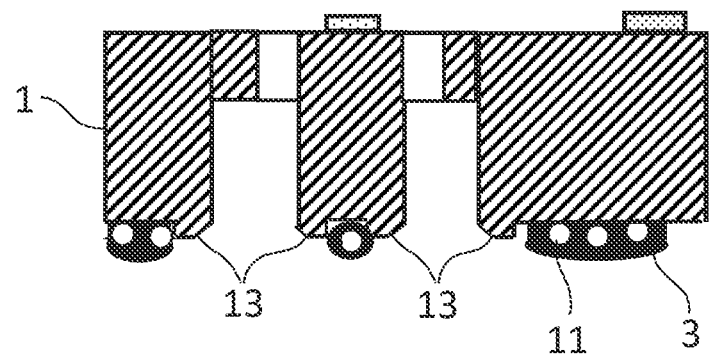
FIG. 7C is a partial cross-sectional view of the first flow-channel substrate 1 that is in a stage where the first flow-channel substrate 1 has been applied with an adhesive 3 in which filler particles 11 are mixed.

Then, as illustrated in FIG. 7C, the adhesive 3 in which the filler particles 11 are mixed is applied onto a predetermined portion of the bottom surface of the first flow-channel substrate 1 on which the convex portion 13 is formed. The adhesive 3 is applied onto an area other than the convex portion 13 (that is, an area around the convex portion). The amount of the adhesive applied onto the bonding surface is a necessary and sufficient amount to cover the whole of the bonding surface (to be bonded) when the adhesive is spread to a thickness equal to the particle diameter of the filler particles 11.

Then, as illustrated in FIG. 8A, the first flow-channel substrate 1 and the second flow-channel substrate 2 are positioned with respect to each other such that the bonding surface of the first flow-channel substrate 1 and the bonding surface of the second flow-channel substrate 2 face each other. As the first flow-channel substrate 1 and the second flow-channel substrate 2 are gradually pressed against each other in a direction in which the first flow-channel substrate 1 and the second flow-channel substrate 2 approach each other, the adhesive spreads gradually on the bonding surface.

When the first flow-channel substrate 1 and the second flow-channel substrate 2 are further pressed against each other, the filler particles 11 abut against both of the first flow-channel substrate 1 and the second flow-channel substrate 2, as illustrated in FIG. 8B. Since the filler particles 11 serve as a spacer, both of the substrates do not approach each other anymore. In a process in which the adhesive spreads on the whole of the bonding surface, the filler particles 11 also move, but do not reach the flow channel of liquid (ink) because the filler particles 11 are blocked by the convex portion 13.

If the diameter of the filler particles 11 is denoted by D, and the maximum height of the convex portion 13 is denoted by h, a clearance equal to or larger than D—his produced between the convex portion 13 of the first flow-channel substrate 1 and the top surface of the second flow-channel substrate 2 because the top surface of the second flow-channel substrate 2 is flat. Thus, as illustrated in an enlarged view of FIG. 8C, when the substrates are pressed against each other, the liquid-phase component of the adhesive 3 flows into the clearance and spreads to the flow channel of liquid (ink). As described above, the convex portion 13 is formed so as to allow the liquid-phase component of the adhesive 3 to easily spread to the flow channel of liquid (ink) than the convex portion 12 of the first embodiment allows the liquid-phase component of the adhesive 3 to do. That is, the convex portion 13 has a slope that causes the thickness of the bonding layer to increase in a direction extending toward an edge surface of the bonding layer. Thus, the whole of the gap between the first flow-channel substrate 1 and the second flow-channel substrate 2 is reliably filled with the liquid-phase component of the adhesive 3.

The first flow-channel substrate 1 and the second flow-channel substrate 2 are then bonded to each other by solidifying the adhesive that has spread on the bonding surface, and then the orifice plate 6 is bonded to the first flow-channel substrate 1, so that the inkjet head is completed as illustrated in FIG. 8B.

Note that a protective film 15 may be formed on the surface of the flow channel of liquid (ink), as in the first embodiment illustrated in FIG. 4, for increasing the resistance of members that constitute the flow channel of liquid (ink). In the present embodiment, since the space between the convex portion 13 of the first flow-channel substrate 1 and the top surface of the second flow-channel substrate 2 is reliably filled with the adhesive, the protective film 15 can be formed so as to have a uniform thickness. The protective film 15 may be a silicon oxide film, a titanium oxide film, a silicon carbide film, or a tantalum oxide film.

As described above, in the present embodiment, since the space between the convex portion 13 of the first flow-channel substrate 1 and the second flow-channel substrate 2 (that faces the first flow-channel substrate 1) is also filled with the adhesive 3, the area of the bonding layer can be made larger, and thus both of the substrates can be bonded to each other by stronger bonding force. Since the distance between both of the substrates is determined by the particle diameter of the filler particles 11 that serve as a spacer, the maximum thickness of the layer of the adhesive 3 is made constant, and both of the substrates can be bonded to each other accurately in parallel (with high shape accuracy). In addition, since the filler particles 11 are blocked by the convex portion 13 when the adhesive spreads, the filler particles 11 are prevented from being exposed to the flow channel of liquid (the penetrating first flow channel 8, the penetrating second flow channel 9). That is, in the present embodiment, it is possible to achieve a bonding method that uniforms the thickness of a bonding layer between members and ensures sufficient bonding strength, and that prevents any particle, contained in the adhesive, from being exposed at an outer edge (edge portion) of the bonding layer.

Third Embodiment

Next, an inkjet head of a third embodiment will be described. Note that the description for features identical to those of the first embodiment will be simplified or omitted.

The third embodiment is the same as the first embodiment in that a convex portion is formed along an edge of the bottom surface of the first flow-channel substrate 1 (that is bonded to the second flow-channel substrate 2), that is, formed along the flow channel of liquid (ink). In the present embodiment, however, another convex portion (second convex portion), other than the convex portion formed along the edge of the bottom surface of the first flow-channel substrate 1, is formed on the bottom surface of the first flow-channel substrate 1. In the first embodiment, in a case where the bonding surface has a large area, when the adhesive is spread on the bonding surface by pressing the first flow-channel substrate 1 and the second flow-channel substrate 2 against each other in a direction in which the first flow-channel substrate 1 and the second flow-channel substrate 2 approach each other, the filler particles 11 move together with the adhesive, possibly causing an uneven distribution of the filler particles 11 in the bonding surface. If the distribution of the filler particles 11 becomes uneven, the bonding strength and the uniformity of thickness of the bonding layer may be lowered. Thus, in the present embodiment, the other convex portion (second convex portion) is formed on the bottom surface of the first flow-channel substrate 1, in addition to the convex portion formed along the edge of the bottom surface of the first flow-channel substrate 1.

Hereinafter, for making an inkjet head of the third embodiment, a method of bonding the first flow-channel substrate 1 and the second flow-channel substrate 2 to each other by using the adhesive 3 will be described with reference to the figures. Note that the figures referred to in the following description are made schematically for convenience of description. Thus, the shape, size, number, arrangement density, and the like of each member are not necessarily the same as those of a real member. In addition, the below-described bonding method is not limited to the method of bonding the first flow-channel substrate 1 and the second flow-channel substrate 2 to each other. That is, the below-described method can be widely used for bonding members to each other for forming the channel of liquid (ink).

Figure 9A:
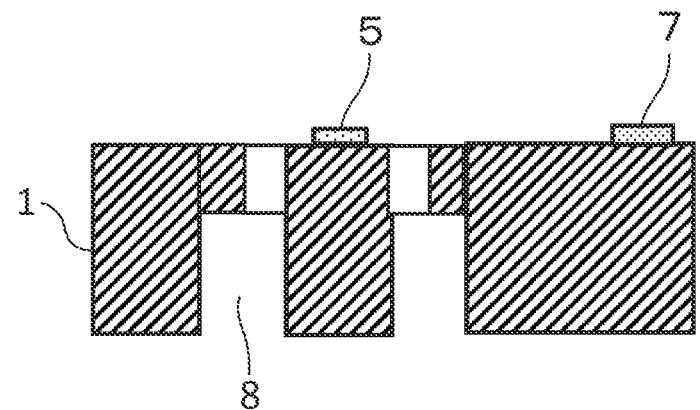
FIG. 9A is a partial cross-sectional view of a first flow-channel substrate 1 of a third embodiment that is being manufactured.

FIG. 9A is a partial cross-sectional view of the first flow-channel substrate 1 in which a groove that serves as the penetrating first flow channel 8, the ejection-energy generation element 5, and the electrode 7 are formed. The bottom surface of the first flow-channel substrate 1, illustrated in FIG. 9A, is bonded to the top surface of the second flow-channel substrate 2 via the adhesive 3.

Figure 9B:
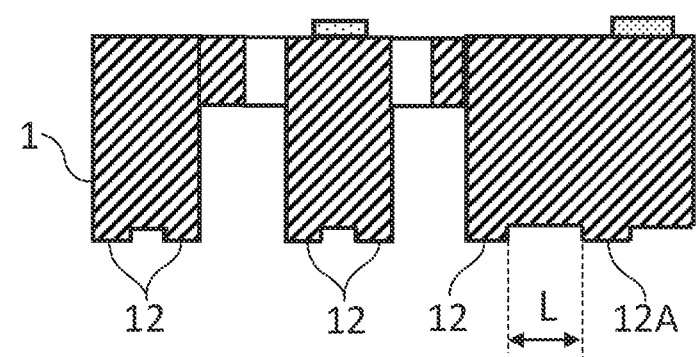
FIG. 9B is a partial cross-sectional view of the first flow-channel substrate 1 that is in a stage where convex portions 12 and 12A have been formed on the first flow-channel substrate 1.

In the present embodiment, before the first flow-channel substrate 1 is bonded to the second flow-channel substrate 2, convex portions 12 and 12A having a predetermined height h and a predetermined width w are formed in advance on the bottom surface of the first flow-channel substrate 1, as illustrated in FIG. 9B. The convex portion 12 is formed on the bottom surface of the first flow-channel substrate 1 (that is bonded to the second flow-channel substrate 2) along the flow channel of liquid (ink). In addition, the convex portion 12A (second convex portion) is formed at a position separated from the convex portion 12 by a predetermined distance L, for preventing the filler particles 11 from moving in a long distance on the bonding surface and being unevenly distributed. Note that the position and the number of the convex portion 12A are not limited to the example illustrated in FIG. 9B.

The convex portions 12 and 12A may be formed by adding a material to the member illustrated in FIG. 9A, or by removing one portion from the bottom surface of the member illustrated in FIG. 9A so that the convex portions 12 and 12A are left. As described above, the convex portions 12 and 12A are formed before the first flow-channel substrate 1 is bonded to the second flow-channel substrate 2. Thus, the convex portions 12 and 12A may not necessarily be formed after the ejection-energy generation element 5 and the electrode 7 are disposed.

The convex portion 12 functions as a barrier that blocks the filler particles, contained in the adhesive, from reaching the flow channel of liquid, when the adhesive is spread on the whole of the bonding surface by pressing (after the application of the adhesive) the first flow-channel substrate 1 and the second flow-channel substrate 2 against each other in a direction in which the first flow-channel substrate 1 and the second flow-channel substrate 2 approach each other.

While the convex portion 12 functions as a barrier that blocks the filler particles from reaching the flow channel of liquid, the convex portion 12A functions as a barrier that prevents the filler particles from moving in a long distance on the bonding surface and being unevenly distributed.

Thus, if the top surface of the second flow-channel substrate 2, to which the first flow-channel substrate 1 is bonded, is flat, the height h of the convex portions 12 and 12A is made smaller than the average particle diameter of the filler particles contained in the adhesive, so that the adhesive can spread on the whole of the bonding surface. Preferably, the height h of the convex portions 12 and 12A is made equal to or larger than 20% of the average particle diameter of the filler particles and smaller than 80% of the average particle diameter, for allowing the adhesive to spread also on the convex portions 12 and 12A and preventing the filler particles, contained in the adhesive, from moving over the convex portions 12 and 12A. That is, the height h of the convex portions 12 and 12A may be set in consideration of the average particle diameter of the filler particles mixed in the adhesive and variations of particle diameters of the filler particles.

If the adhesive is applied onto the bottom surface of the first flow-channel substrate 1 by using a transfer method, it is preferable that the width w of the convex portions 12 and 12A be decreased to the extent that the adhesive is not transferred to the convex portions 12 and 12A. This is because if the width w of the convex portions 12 and 12A is increased too much, the adhesive in which the filler particles are mixed will be transferred to the convex portions 12 and 12A, and the filler particles may reach the flow channel of liquid when the substrates are pressed against each other. Thus, the width w of the convex portions 12 and 12A may be set in accordance with the viscosity and the transfer performance of the adhesive 3.

Figure 9C:
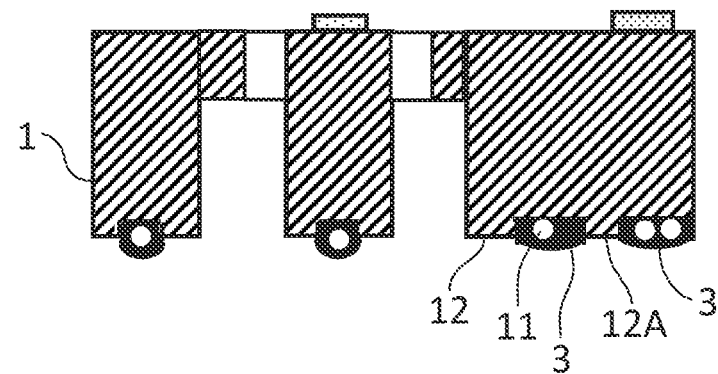
FIG. 9C is a partial cross-sectional view of the first flow-channel substrate 1 that is in a stage where the first flow-channel substrate 1 has been applied with an adhesive 3 in which filler particles 11 are mixed.

Then, as illustrated in FIG. 9C, the adhesive 3 in which the filler particles 11 are mixed is applied onto a predetermined portion of the bottom surface of the first flow-channel substrate 1 on which the convex portions 12 and 12A are formed. The adhesive 3 is applied onto an area other than the convex portions 12 and 12A (that is, an area around the convex portions 12 and 12A). The amount of the adhesive applied onto the bonding surface is a necessary and sufficient amount to cover the whole of the bonding surface (to be bonded) when the adhesive is spread to a thickness equal to the particle diameter of the filler particles 11.

Figure 10A:
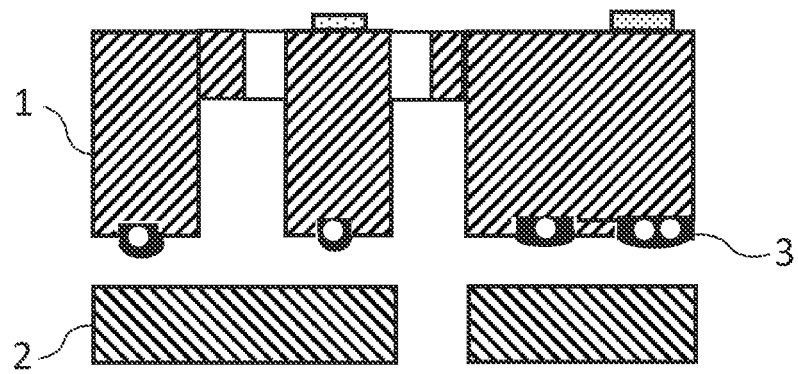
FIG. 10A is a diagram illustrating a state where the first flow-channel substrate 1 and a second flow-channel substrate 2 of the third embodiment are disposed so as to face each other.

Then, as illustrated in FIG. 10A, the first flow-channel substrate 1 and the second flow-channel substrate 2 are positioned with respect to each other such that the bonding surface of the first flow-channel substrate 1 and the bonding surface of the second flow-channel substrate 2 face each other. As the first flow-channel substrate 1 and the second flow-channel substrate 2 are gradually pressed against each other in a direction in which the first flow-channel substrate 1 and the second flow-channel substrate 2 approach each other, the adhesive spreads gradually on the bonding surface.

Figure 10B:
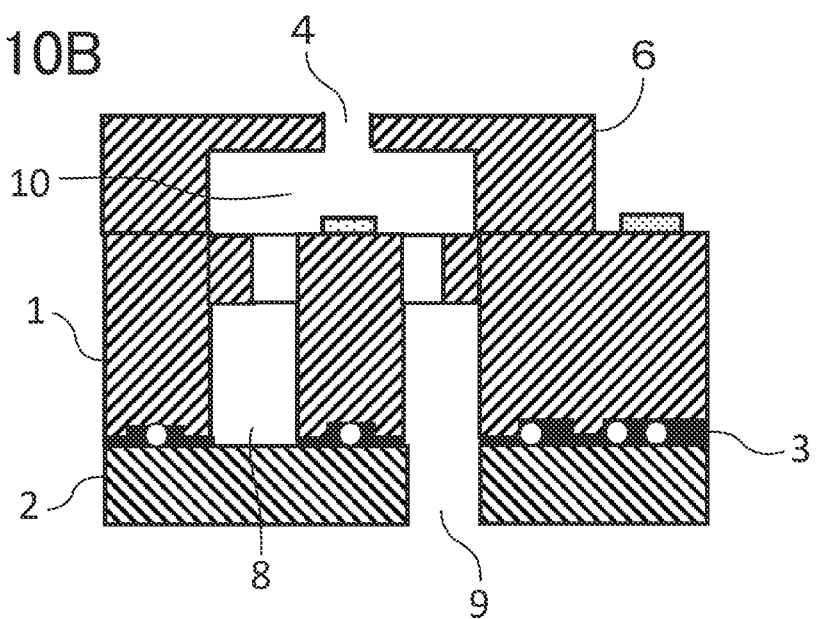
FIG. 10B is a partial cross-sectional view of an inkjet head of the third embodiment in which the first flow-channel substrate 1 and the second flow-channel substrate 2 are bonded to each other.

When the first flow-channel substrate 1 and the second flow-channel substrate 2 are further pressed against each other, the filler particles 11 abut against both of the first flow-channel substrate 1 and the second flow-channel substrate 2, as illustrated in FIG. 10B. Since the filler particles 11 serve as a spacer, both of the substrates do not approach each other anymore. In a process in which the adhesive spreads on the whole of the bonding surface, the filler particles 11 also move, but do not reach the flow channel of liquid (ink) because the filler particles 11 are blocked by the convex portion 12. In addition, since the convex portion 12A is formed, the filler particles 11 are prevented from moving in a long distance on the bonding surface and being unevenly distributed.

Figure 10C:
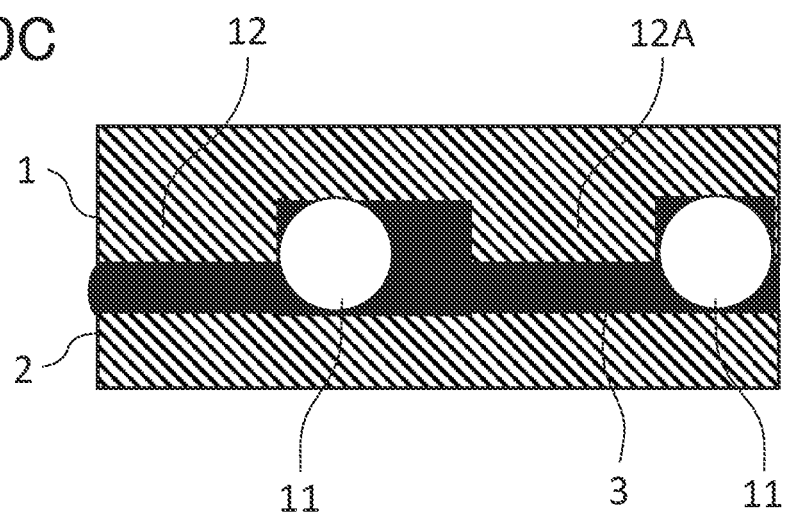
FIG. 10C is a partial cross-sectional view in which the convex portions 12 and 12A and their surroundings are enlarged.

If the diameter of the filler particles 11 is denoted by D, and the height of the convex portions 12 and 12A is denoted by h, a clearance equal to or larger than D-h is produced between the convex portions 12 and 12A of the first flow-channel substrate 1 and the top surface of the second flow-channel substrate 2 because the top surface of the second flow-channel substrate 2 is flat. Thus, as illustrated in an enlarged view of FIG. 10C, when the substrates are pressed against each other, the liquid-phase component of the adhesive 3 flows into the clearance and spreads to the flow channel of liquid (ink). That is, in the present embodiment, the whole of the clearance between the first flow-channel substrate 1 and the second flow-channel substrate 2 is filled with the liquid-phase component of the adhesive 3, while the filler particles are prevented from being unevenly arranged.

The first flow-channel substrate 1 and the second flow-channel substrate 2 are then bonded to each other by solidifying the adhesive that has spread on the bonding surface, and then the orifice plate 6 is bonded to the first flow-channel substrate 1, so that the inkjet head is completed as illustrated in FIG. 10B.

Note that a protective film 15 may be formed on the surface of the flow channel of liquid (ink), as in the first embodiment illustrated in FIG. 4, for increasing the resistance of members that constitute the flow channel of liquid (ink). In the present embodiment, since the space between the convex portions 12 and 12A of the first flow-channel substrate 1 and the top surface of the second flow-channel substrate 2 is reliably filled with the adhesive, the protective film 15 can be formed so as to have a uniform thickness. The protective film 15 may be a silicon oxide film, a titanium oxide film, a silicon carbide film, or a tantalum oxide film.

As described above, in the present embodiment, since the space between the convex portions 12 and 12A of the first flow-channel substrate 1 and the second flow-channel substrate 2 (that faces the first flow-channel substrate 1) is also filled with the adhesive 3, the area of the bonding layer can be made larger, and thus both of the substrates can be bonded to each other by stronger bonding force. In addition, since the filler particles 11 are blocked by the convex portion 12 when the adhesive spreads, the filler particles 11 are prevented from being exposed to the flow channel of liquid (the penetrating first flow channel 8, the penetrating second flow channel 9). In addition, since the filler particles 11 are blocked by the convex portion 12A when the adhesive spreads, the filler particles 11 are prevented from being locally distributed. Since the distance between the substrates is determined by the filler particles 11 arranged in the bonding surface with high uniformity, the maximum thickness of the bonding layer becomes constant, and both of the substrates can be bonded to each other accurately in parallel (with high shape accuracy). That is, in the present embodiment, it is possible to achieve a bonding method that uniforms the thickness of a bonding layer between members and ensures sufficient bonding strength, and that prevents any particle, contained in the adhesive, from being exposed at an outer edge (edge portion) of the bonding layer.

EXAMPLES

Example 1

Next, a specific example of the first embodiment will be described. First, the first flow-channel substrate 1 as illustrated in FIG. 2A is prepared. On the first flow-channel substrate 1, the ejection-energy generation element 5, an electric circuit (not illustrated), and the electrode 7 are disposed. The ejection-energy generation element 5 is made of TaSiN and used for ejecting droplets, the electric circuit is used for driving the ejection-energy generation element 5, and the electrode 7 is electrically connected to an external circuit. The first flow-channel substrate 1 is made of silicon, and is made thinner by using a grinding apparatus until the thickness of the first flow-channel substrate 1 is 625 µm.

Then, opening portions are formed in the first flow-channel substrate 1 by using the photolithography that uses a positive resist. The opening portions are rectangular, the size of each of the opening portions is 150×50 µm, and the distance between adjacent opening portions is 100 µm. Then, for forming the penetrating first flow channel 8, a through-hole having a diameter of 50 µm is formed in the first flow-channel substrate 1 at a position at which the front surface side of the first flow-channel substrate 1 communicates with a main opening portion.

Then the convex portion 12 illustrated in FIG. 2B is formed on the first flow-channel substrate 1. Specifically, by using the photolithography that uses a positive resist, a mask pattern is made for forming the convex portion 12. For example, the convex portion 12 is rectangular in a plan view, and has a size of 150×20 µm. For making it difficult to transfer the adhesive, which contains the filler particles, to the convex portion 12, the width w of the convex portion 12 is preferably equal to or smaller than 20 µm. More preferably, the width w of the convex portion 12 is equal to or larger than 1 µm and equal to or smaller than 20 µm, and still more preferably, the width w of the convex portion 12 is equal to or larger than 3 µm and equal to or smaller than 18 µm. By using the patterned positive resist as a mask, the first flow-channel substrate 1 is etched through a dry etching process so that the convex portion 12 having a height h of 8 µm is formed (left).

Then, the second flow-channel substrate 2 is prepared. The second flow-channel substrate 2 has an opening portion that corresponds to the first flow-channel substrate 1.

In addition, a base material for transferring adhesive is prepared for transferring the adhesive to the bottom surface of the first flow-channel substrate 1. The adhesive is prepared by dispersing glass beads in an adhesive that is a benzocyclobutene solution. The average particle diameter of the glass beads is 10 µm, and the glass beads is dispersed in the adhesive at a mass ratio of 0.5%. If the mass ratio of the glass beads is too small, controlling the thickness of the bonding layer will become difficult; if the mass ratio of the glass beads is too large, the strong bonding force of the adhesive will be impaired. For this reason, the content of the glass beads contained in the bonding layer is set in a range equal to or larger than 0.2 mass % and equal to or smaller than 1.0 mass %. Although the inexpensive glass beads are used in the present example, alumina beads or titania beads may be used. Then, the PET film is spin-coated with the adhesive such that the layer of the adhesive has a thickness of 13 µm. After the spin coating, a baking process is performed at a temperature of 100° C. for 5 minutes, for volatilizing the solvent of the adhesive.

The base material for transferring adhesive, made in this manner, is brought into contact with the bottom surface of the first flow-channel substrate 1 while the base material is heated, so that the adhesive in which the glass beads are mixed is transferred to the first flow-channel substrate 1. Since the width w of the convex portion 12 has been set so that the adhesive that contains the filler particles is hardly transferred to the convex portion 12, the adhesive 3 is transferred to a portion of the bottom surface of the first flow-channel substrate 1 other than the convex portion 12, as illustrated in FIG. 2C. Note that the adhesive may be transferred to the first flow-channel substrate 1 by using another method other than the transfer method as long as the method can control the amount and the position of the adhesive applied onto the first flow-channel substrate 1. For example, a screen-printing method or a dispenser method may be used.

Then, by using an aligning-and-joining apparatus, the first flow-channel substrate 1 and the second flow-channel substrate 2 are heated and joined with each other in a vacuum while the first flow-channel substrate 1 and the second flow-channel substrate 2 are positioned with respect to each other. The joining is performed at a degree of vacuum of 100 Pa or less and at a temperature of 150° C. After the joining is completed, the first flow-channel substrate 1 and the second flow-channel substrate 2 are cooled once, and then heated at a temperature of 250° C. for one hour in an oven, in a thermal process. Specifically, the first flow-channel substrate 1 and the second flow-channel substrate 2 are heated in an atmosphere of nitrogen, in the oven, for curing the adhesive. In the thermal process, the filler particles 11 are blocked by the convex portion 12 even though the filler particles 11 move, while the liquid-phase component of the adhesive flows through the clearance between the convex portion 12 and the surface of the substrate, to the edge portion of the bonding layer.

Then, a PET film is spin-coated with a solution in which a negative photosensitive resin is dissolved in a PGMEA solvent. The PET film is dried in an oven at 100° C. into a dry film, and after that, the dry film is transferred to a surface of the first flow-channel substrate 1 on which the ejection-energy generation element 5 is disposed. After the dry film is transferred, exposure and PEB are performed for forming a latent image of the flow channel of liquid. Then another dry film is laminated on the dry film, and exposure and PEB are performed for forming a latent image of the ejection orifice 4. The latent images of the flow channel of liquid and the ejection orifice 4 are then collectively developed for forming a liquid ejection head.

The inkjet heads of the present example, the first comparative embodiment, and the second comparative embodiment were subjected to a durability test. As a result, it was found that the average life of the inkjet head of the present example is 1.5 or more times longer than the average life of the inkjet heads of the first and second comparative embodiments.

Example 2

Next, a specific example of the second embodiment will be described. First, the first flow-channel substrate 1 as illustrated in FIG. 7A is prepared. On the first flow-channel substrate 1, the ejection-energy generation element 5, an electric circuit (not illustrated), and the electrode 7 are disposed. The ejection-energy generation element 5 is made of TaSiN and used for ejecting droplets, the electric circuit is used for driving the ejection-energy generation element 5, and the electrode 7 is electrically connected to an external circuit. The first flow-channel substrate 1 is made of silicon, and is made thinner by using a grinding apparatus until the thickness of the first flow-channel substrate 1 is 625 μm.

Then, opening portions are formed in the first flow-channel substrate 1 by using the photolithography that uses a positive resist. The opening portions are rectangular, the size of each of the opening portions is 150×50 and the distance between adjacent opening portions is 100 μm. Then, for forming the penetrating first flow channel 8, a through-hole having a diameter of 50 μm is formed in the first flow-channel substrate 1 at a position at which the front surface side of the first flow-channel substrate 1 communicates with a main opening portion.

Then the convex portion 13 illustrated in FIG. 7B is formed on the first flow-channel substrate 1. Specifically, by using the photolithography that uses a positive resist, a mask pattern is made for forming the convex portion 13. The convex portion 13 has a rectangular top surface and a tapered surface. For example, the top surface has a size of 120×10 μm in a plan view, and the tapered surface has a size of 120×10 μm in a plan view. The height of the convex portion 13 is 3 μm.

By using the patterned positive resist as a mask, the first flow-channel substrate 1 is etched through a dry etching process so that the convex portion 13 having a height h of 3 μm is formed (left).

Then, the second flow-channel substrate 2 is prepared. The second flow-channel substrate 2 has an opening portion that corresponds to the first flow-channel substrate 1.

In addition, a base material for transferring adhesive is prepared for transferring the adhesive to the bottom surface of the first flow-channel substrate 1. The adhesive is prepared by dispersing glass beads in an adhesive that is a benzocyclobutene solution. The average particle diameter of the glass beads is 5 μm, and the glass beads is dispersed in the adhesive at a mass ratio of 0.8%. If the mass ratio of the glass beads is too small, controlling the thickness of the bonding layer will become difficult; if the mass ratio of the glass beads is too large, the strong bonding force of the adhesive will be impaired. For this reason, the content of the glass beads contained in the bonding layer is set in a range equal to or larger than 0.2 mass % and equal to or smaller than 1.0 mass %. Although the inexpensive glass beads are used in the present example, alumina beads or titania beads may be used. Then, the PET film is spin-coated with the adhesive such that the layer of the adhesive has a thickness of 7 μm. After the spin coating, a baking process is performed at a temperature of 100° C. for 5 minutes, for volatilizing the solvent of the adhesive.

The base material for transferring adhesive, made in this manner, is brought into contact with the bottom surface of the first flow-channel substrate 1 while the base material is heated, so that the adhesive in which the glass beads are mixed is transferred to the first flow-channel substrate 1. Since the width w of the convex portion 13 has been set so that the adhesive that contains the filler particles is hardly transferred to the convex portion 13, the adhesive 3 is transferred to a portion of the bottom surface of the first flow-channel substrate 1 other than the convex portion 12, as illustrated in FIG. 7C. Note that the adhesive may be transferred to the first flow-channel substrate 1 by using another method other than the transfer method as long as the method can control the amount and the position of the adhesive applied onto the first flow-channel substrate 1. For example, a screen-printing method or a dispenser method may be used.

Then, by using an aligning-and-joining apparatus, the first flow-channel substrate 1 and the second flow-channel substrate 2 are heated and joined with each other in a vacuum while the first flow-channel substrate 1 and the second flow-channel substrate 2 are positioned with respect to each other. The joining is performed at a degree of vacuum of 100 Pa or less and at a temperature of 150° C. After the joining is completed, the first flow-channel substrate 1 and the second flow-channel substrate 2 are cooled once, and then heated at a temperature of 250° C. for one hour in an oven, in a thermal process. Specifically, the first flow-channel substrate 1 and the second flow-channel substrate 2 are heated in an atmosphere of nitrogen, in the oven, for curing the adhesive. In the thermal process, the filler particles are blocked by the convex portion 13 even though the filler particles 11 move, while the liquid-phase component of the adhesive flows through the clearance between the convex portion 13 and the surface of the substrate, and through the tapered portion, and reliably reaches the edge portion of the bonding layer.

Then, a PET film is spin-coated with a solution in which a negative photosensitive resin is dissolved in a PGMEA solvent. The PET film is dried in an oven at 100° C. into a dry film, and after that, the dry film is transferred to a surface of the first flow-channel substrate 1 on which the ejection-energy generation element 5 is disposed. After the dry film is transferred, exposure and PEB are performed for forming a latent image of the flow channel of liquid. Then another dry film is laminated on the dry film, and exposure and PEB are performed for forming a latent image of the ejection orifice 4. The latent images of the flow channel of liquid and the ejection orifice 4 are then collectively developed for forming a liquid ejection head.

The inkjet heads of the present example, the first comparative embodiment, and the second comparative embodiment were subjected to a durability test. As a result, it was found that the average life of the inkjet head of the present example is 1.5 or more times longer than the average life of the inkjet heads of the first and second comparative embodiments.

Example 3

Next, a specific example of the third embodiment will be described. First, the first flow-channel substrate 1 as illustrated in FIG. 9A is prepared. On the first flow-channel substrate 1, the ejection-energy generation element 5, an electric circuit (not illustrated), and the electrode 7 are disposed. The ejection-energy generation element 5 is made of TaSiN and used for ejecting droplets, the electric circuit is used for driving the ejection-energy generation element 5, and the electrode 7 is electrically connected to an external circuit. The first flow-channel substrate 1 is made of silicon, and is made thinner by using a grinding apparatus until the thickness of the first flow-channel substrate 1 is 625 μm.

Then, opening portions are formed in the first flow-channel substrate 1 by using the photolithography that uses a positive resist. The opening portions are rectangular, the size of each of the opening portions is 140×50 and the distance between adjacent opening portions is 100 μm. Then, for forming the penetrating first flow channel 8, a through-hole having a diameter of 50 μm is formed in the first flow-channel substrate 1 at a position at which the front surface side of the first flow-channel substrate 1 communicates with a main opening portion.

Then the convex portions 12 and 12A illustrated in FIG. 9B are formed on the first flow-channel substrate 1. Specifically, by using the photolithography that uses a positive resist, a mask pattern is made for forming the convex portions 12 and 12A. For example, the convex portions 12 and 12A are rectangular in a plan view, and have a size of 140×20 μm. For making it difficult to transfer the adhesive, which contains the filler particles, to the convex portions 12 and 12A, the width w of the convex portions 12 and 12A is preferably equal to or smaller than 20 μm. More preferably, the width w of the convex portions 12 and 12A is equal to or larger than 1 μm and equal to or smaller than 20 and still more preferably, the width w of the convex portions 12 and 12A is equal to or larger than 3 μm and equal to or smaller than 18 μm. By using the patterned positive resist as a mask, the first flow-channel substrate 1 is etched through a dry etching process so that the convex portions 12 and 12A having a height h of 15 μm are formed (left).

Then, the second flow-channel substrate 2 is prepared. The second flow-channel substrate 2 has an opening portion that corresponds to the first flow-channel substrate 1.

In addition, a base material for transferring adhesive is prepared for transferring the adhesive to the bottom surface of the first flow-channel substrate 1. The adhesive is prepared by dispersing glass beads in an adhesive that is a benzocyclobutene solution. The average particle diameter of the glass beads is 18 μm, and the glass beads is dispersed in the adhesive at a mass ratio of 1.0%. If the mass ratio of the glass beads is too small, controlling the thickness of the bonding layer will become difficult; if the mass ratio of the glass beads is too large, the strong bonding force of the adhesive will be impaired. For this reason, the content of the glass beads contained in the bonding layer is set in a range equal to or larger than 0.2 mass % and equal to or smaller than 1.0 mass %. Although the inexpensive glass beads are used in the present example, alumina beads or titania beads may be used. Then, the PET film is spin-coated with the adhesive such that the layer of the adhesive has a thickness of 20 μm. After the spin coating, a baking process is performed at a temperature of 100° C. for 5 minutes, for volatilizing the solvent of the adhesive.

The base material for transferring adhesive, made in this manner, is brought into contact with the bottom surface of the first flow-channel substrate 1 while the base material is heated, so that the adhesive in which the glass beads are mixed is transferred to the first flow-channel substrate 1. Since the width w of the convex portions 12 and 12A has been set so that the adhesive that contains the filler particles is hardly transferred to the convex portions 12 and 12A, the adhesive 3 is transferred to a portion of the bottom surface of the first flow-channel substrate 1 other than the convex portions 12 and 12A, as illustrated in FIG. 9C. Note that the adhesive may be transferred to the first flow-channel substrate 1 by using another method other than the transfer method as long as the method can control the amount and the position of the adhesive applied onto the first flow-channel substrate 1. For example, a screen-printing method or a dispenser method may be used.

Then, by using an aligning-and-joining apparatus, the first flow-channel substrate 1 and the second flow-channel substrate 2 are heated and joined with each other in a vacuum while the first flow-channel substrate 1 and the second flow-channel substrate 2 are positioned with respect to each other. The joining is performed at a degree of vacuum of 100 Pa or less and at a temperature of 150° C. After the joining is completed, the first flow-channel substrate 1 and the second flow-channel substrate 2 are cooled once, and then heated at a temperature of 250° C. for one hour in an oven, in a thermal process. Specifically, the first flow-channel substrate 1 and the second flow-channel substrate 2 are heated in an atmosphere of nitrogen, in the oven, for curing the adhesive. In the thermal process, the filler particles 11 are blocked by the convex portions 12 and 12A even though the filler particles 11 move, while the clearance between the convex portion 12 and the surface of the substrate, and the clearance between the convex portion 12A and the surface of the substrate are filled with the liquid-phase component of the adhesive. In the present example, even if the bonding surface has a large area, the filler particles are arranged evenly. Thus, the thickness of the bonding layer is controlled with high accuracy at any position.

Then, a PET film is spin-coated with a solution in which a negative photosensitive resin is dissolved in a PGMEA solvent. The PET film is dried in an oven at 100° C. into a dry film, and after that, the dry film is transferred to a surface of the first flow-channel substrate 1 on which the ejection-energy generation element 5 is disposed. After the dry film is transferred, exposure and PEB are performed for forming a latent image of the flow channel of liquid. Then another dry film is laminated on the dry film, and exposure and PEB are performed for forming a latent image of the ejection orifice 4. The latent images of the flow channel of liquid and the ejection orifice 4 are then collectively developed for forming a liquid ejection head.

The inkjet heads of the present example, the first comparative embodiment, and the second comparative embodiment were subjected to a durability test. As a result, it was found that the average life of the inkjet head of the present example is 1.5 or more times longer than the average life of the inkjet heads of the first and second comparative embodiments.

Modifications

In the above-described embodiments, the convex portion is formed on the first flow-channel substrate 1, and the adhesive is applied onto the first flow-channel substrate 1. However, the convex portion may be formed on the second flow-channel substrate 2, and the adhesive may be applied onto the second flow-channel substrate 2.

Figure 11A:
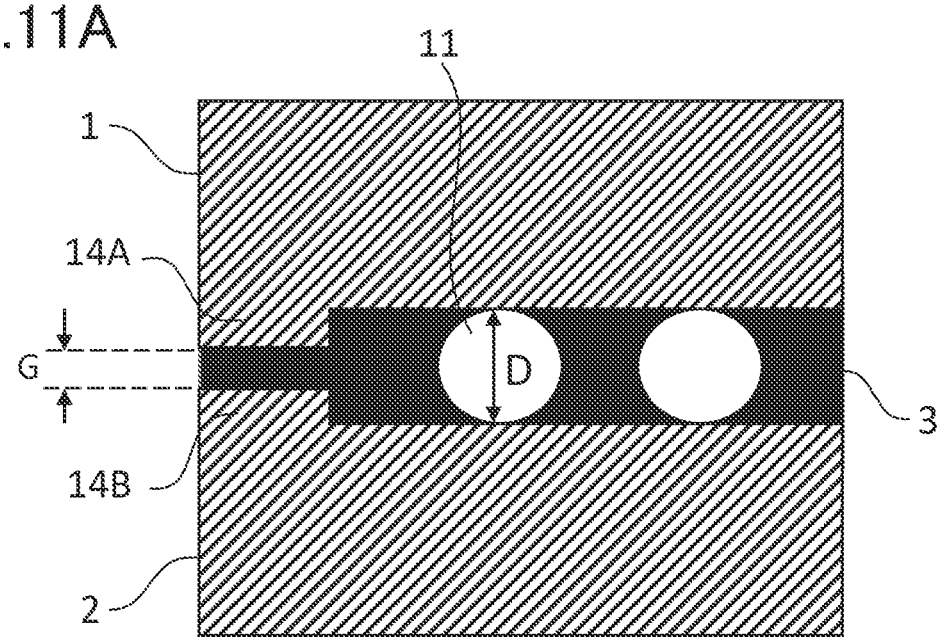
FIG. 11A is a partial cross-sectional view in which convex portions and their surroundings are enlarged in an embodiment in which the convex portions are formed on both substrates.

In addition, the convex portion may not necessary be formed on only one of the members. For example, as illustrated in FIG. 11A, a convex portion 14A may be formed on the first flow-channel substrate 1 and a convex portion 14B may be formed on the second flow-channel substrate 2 such that the convex portion 14A and the convex portion 14B face each other. In short, the present disclosure is applicable as long as the gap G formed between the first flow-channel substrate 1 and the second flow-channel substrate 2 along the flow channel of liquid (ink) is smaller than the diameter D of the filler particles 11.

Figure 11B:
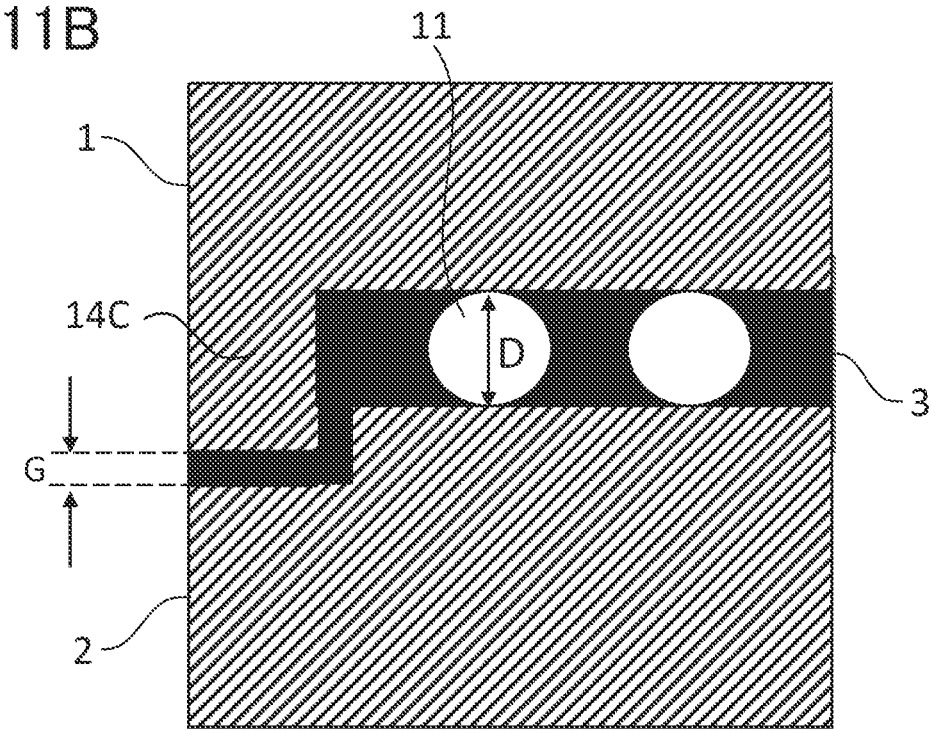
FIG. 11B is a partial cross-sectional view in which a convex portion and its surroundings are enlarged in an embodiment in which the convex portion has a height larger than a diameter of filler particles.

In addition, although the top surface (bonding surface) of the second flow-channel substrate 2 is flat in the above-described embodiments, the whole of the bonding surface of a member that faces a member having the convex portion may not be flat. For example, as illustrated in FIG. 11B, the height of a convex portion 14C of the first flow-channel substrate 1 may be made larger than the diameter D of the filler particles 11, and a concave portion may be formed in the second flow-channel substrate 2 at a position at which the concave portion faces the convex portion 14C. In short, the present disclosure is applicable as long as the gap G formed between the first flow-channel substrate 1 and the second flow-channel substrate 2 along the flow channel of liquid (ink) is smaller than the diameter D of the filler particles 11.

The gap G between the first flow-channel substrate 1 and the second flow-channel substrate 2 that is smaller than the diameter D of the filler particles 11 has only to be filled with the liquid-phase component of the adhesive. Thus, the gap G may be bent as illustrated in FIG. 11B.

In addition, the adhesive that contains the filler particles may not necessarily be applied onto the substrate on which the convex portion is formed. If the control accuracy for applying the adhesive onto a target portion, and the positioning accuracy for positioning both of the substrates with respect to each other are sufficiently high, the adhesive may be applied onto the substrate opposite to the substrate on which the convex portion is formed, and the substrates may be bonded to each other.

In the embodiments, the thickness of the bonding layer is smaller than the diameter of the filler particles at an outer edge portion of the bonding layer (at least one portion of the edge portion of the bonding layer) that is exposed to the flow channel of liquid. In other words, at at least one portion of the edge portion of the bonding layer, the distance between the bottom surface (first surface) of the first flow-channel substrate 1 and the top surface (second surface) of the second flow-channel substrate 2 is smaller than the diameter of the filler particles.

In the embodiments, the distance between the members can be controlled with high accuracy by using the adhesive that contains the filler particles, a sufficient bonding area can be secured, and any filler particle is not exposed at the edge portion of the bonding layer. Thus, the present disclosure can be suitably used for inkjet heads. In addition, the present invention can also be applied in the fields of devices, other than the inkjet heads, in which any filler particle is required not to be exposed at the edge portion of the bonding layer. For example, the present invention can be applied to a device that processes liquid or gas as fluid, for bonding members of the device that define a flow channel.

In the above-described embodiments, it is possible to provide a bonding method that uniforms the thickness of a bonding layer between members and ensures sufficient bonding strength, and that prevents any particle, contained in the adhesive, from being exposed at an outer edge of the bonding layer.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-3468, filed Jan. 13, 2022, which is hereby incorporated by reference herein in its entirety.

What is claimed is:

1. A device comprising:
   a first member;
   a second member; and
   a bonding layer,
   wherein a first surface of the first member and a second surface of the second member are bonded to each other via the bonding layer,
   wherein the bonding layer includes a filler particle configured to be in contact with both of the first surface and the second surface, and a solidified adhesive, and
   wherein a distance between the first surface and the second surface is smaller than a diameter of the filler particle at at least one portion of an outer edge of the bonding layer,
   wherein the first member and/or the second member includes a convex portion formed along the at least one portion of the outer edge and projecting in a direction in which the distance between the first surface and the second surface is decreased, and
   wherein the convex portion includes a surface inclined such that a thickness of the bonding layer increases at the at least one portion of the outer edge in a direction extending toward an edge surface.

2. The device according to claim 1, wherein a width of the convex portion is 1 µm to 20 µm.

3. The device according to claim 1, wherein the convex portion is configured to project from a flat surface.

4. The device according to claim 1, wherein a height of the convex portion is 20% to less than 80% of an average particle diameter of the filler particle.

5. The device according to claim 1, wherein a second convex portion is formed at a position separated from the at least one portion of the outer edge, and is configured to decrease the distance between the first surface and the second surface.

6. The device according to claim 1, wherein a particle diameter of the filler particle is 1 µm to less than 20 µm.

7. A device comprising:
a first member;
a second member; and
a bonding layer,
wherein a first surface of the first member and a second surface of the second member are bonded to each other via the bonding layer,
wherein the bonding layer includes a filler particle configured to be in contact with both of the first surface and the second surface, and a solidified adhesive,
wherein a distance between the first surface and the second surface is smaller than a diameter of the filler particle at at least one portion of an outer edge of the bonding layer, and
wherein a content of the filler particle in the bonding layer is 0.2 mass % to 1.0 mass %.

8. The device according to claim 1, wherein the filler particle is at least one selected from a group consisting of a glass bead, an alumina particle, and a titanium particle.

9. The device according to claim 1, wherein the first member and the second member are configured to define a flow channel of fluid, and the filler particle is not exposed to the flow channel.

10. The device according to claim 9, wherein an edge surface of the bonding layer at the at least one portion of the outer edge is exposed to the flow channel of fluid.

11. The device according to claim 9, further comprising a protective layer, wherein an edge surface of the bonding layer at the at least one portion of the outer edge is covered with the protective layer.

12. The device according to claim 9, wherein the thickness of the bonding layer at the at least one portion of the outer edge increases in a direction extending toward the flow channel of fluid.

13. The device according to claim 9, wherein the fluid is ink.

14. A device comprising:
a first member;
a second member; and
a bonding layer,
wherein a first surface of the first member and a second surface of the second member are bonded to each other via the bonding layer,
wherein the bonding layer includes a filler particle configured to be in contact with both of the first surface and the second surface, and a solidified adhesive,
wherein a distance between the first surface and the second surface is smaller than a diameter of the filler particle at at least one portion of an outer edge of the bonding layer, and
wherein a base material of the first member and the second member is silicon.

* * * * *